（12）United States Patent
Cho et al.

(10) Patent No.: US 10,261,348 B2
(45) Date of Patent: Apr. 16, 2019

(54) DISPLAY DEVICE

(71) Applicant: LG Display Co., Ltd., Seoul (KR)

(72) Inventors: Wonjong Cho, Seoul (KR); Daeheung Lee, Paju-si (KR); Wonki Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/702,506

(22) Filed: Sep. 12, 2017

(65) Prior Publication Data

US 2018/0095303 A1    Apr. 5, 2018

(30) Foreign Application Priority Data

Sep. 30, 2016   (KR) .......................... 10-2016-0126909

(51) Int. Cl.
| | | |
|---|---|---|
| *G02F 1/1343* | (2006.01) | |
| *G02F 1/01* | (2006.01) | |
| *G02F 1/00* | (2006.01) | |
| *H01L 51/52* | (2006.01) | |
| *G02B 5/30* | (2006.01) | |

(52) U.S. Cl.
CPC .......... *G02F 1/0136* (2013.01); *G02F 1/0063* (2013.01); *H01L 51/5203* (2013.01); *H01L 51/5281* (2013.01); *H01L 51/5293* (2013.01); *G02B 5/3066* (2013.01); *H01L 51/5275* (2013.01)

(58) Field of Classification Search
CPC .. G01F 1/0136; G02B 5/3066; G01G 1/0063; H01L 51/5293
See application file for complete search history.

(56) References Cited

U.S. PATENT DOCUMENTS

| | | | | |
|---|---|---|---|---|
| 2005/0046321 A1* | 3/2005 | Suga | .................... | G02B 5/0226 313/112 |
| 2007/0230158 A1* | 10/2007 | Kitayama | ......... | G02F 1/133603 362/84 |
| 2015/0323707 A1* | 11/2015 | Shim | ................... | G02B 3/0037 257/40 |

* cited by examiner

*Primary Examiner* — Selim U Ahmed
*Assistant Examiner* — Andre Stevenson
(74) *Attorney, Agent, or Firm* — Polsinelli PC

(57) ABSTRACT

A display device according to the present disclosure may be provided with a light path conversion protrusion on a lower surface of a cover window to suppress external light even for light incident at a side viewing angle, thereby improving contrast and visibility.

According to the present disclosure, side-view angle incident light may be converted into the same incident light as that of vertical incident light, thereby providing an effect capable of preventing the reflection of incident light from a viewing angle as well as the vertical incident light.

18 Claims, 16 Drawing Sheets

Incident light source
(45°)

After convergence
(90°)

DISPLAY DEVICE

CROSS-REFERENCE TO RELATED APPLICATION

This application claims the benefit of Korean Patent Application No. 10-2016-0126909, filed on Sep. 30, 2016, which is hereby incorporated by reference in its entirety for all purposes as if fully set forth herein.

BACKGROUND

Field of the Disclosure

The present disclosure relates to a display device, and more particularly, to a display device capable of suppressing external light reflection when light is incident from tilted directions from a viewing angle, thereby improving contrast and visibility.

Description of the Background

In recent years, flat panel display devices which can be easily realized with a large area and can be made thin and light have been rapidly appeared in the market.

Such a display device includes a liquid crystal display (LCD), a plasma display panel (PDP), an organic light emitting display (OLED), and the like.

These flat panel display devices use a circular polarizer or an anti-reflective (AR) film or the like in order to suppress reflection of external light and improve contrast and visibility.

FIG. 1 is a cross-sectional view schematically illustrating a display device according to the related art.

Referring to FIG. 1, a display device of the related art includes a display device 10, an anti-reflection polarizing film 20 disposed on the display device 10, and a cover window 30 disposed on the anti-reflection polarizing film 20.

Here, the anti-reflection polarizing film 20 is a component for preventing incident light from being reflected in a predetermined direction such as a linear polarizer (refer to reference numeral 20a in FIG. 2) and a circular polarizer (refer to reference numeral 20b in FIG. 2).

FIG. 2 is a view schematically illustrating a light path of front incident light in a display device according to the related art.

Referring to FIG. 2, light incident on the front surface is linearly polarized at 0 degree while passing through the linear polarizer 20a, and the 0-degree linearly polarized light is converted into left-handed circularly polarized light while passing through the circular polarizer 20b therebelow.

Then, the left-handed circularly polarized light is reflected from the display panel 10 and converted into right-handed circularly polarized light.

Furthermore, the converted right-handed circularly polarized light is converted into 90-degree linearly polarized light while passing through the circular polarizer 20b, and the 90-degree linearly polarized light is finally absorbed through the linear polarizer 20a to prevent reflection.

Therefore, even if a part of light incident on the front surface is reflected within the display device, the reflected light is substantially absorbed into an inside of the display device, namely, the linear polarizer 20a, to prevent reflection to an outside of the display device.

FIG. 3 is a view schematically illustrating a light path of side incident light in a display device according to the related art.

However, referring to FIG. 3, light incident on a side having a viewing angle of less than 90 degrees is unable to realize complete linear and circular polarization while passing through the linear polarizer 20a and the circular polarizer 20b, and a part of light is converted into elliptically polarized light, and finally passes through the linear polarizer 20a to reflect the light to the outside.

Therefore, in a display device according to the related art, in case of light incident vertically on the front surface, reflection to the outside of the display device may be prevented, but when the light incident from tilted directions from a viewing angle of the display device, reflection to the outside of the display device may increase, thereby resulting in that the reflectance is high and a color change such as a color shift is present.

SUMMARY

The present disclosure is to provide a display device capable of suppressing reflection of external light even for light incident at a viewing angle as well as front incident light, thereby improving contrast and visibility.

In an aspect of the present disclosure, there is provided a display device, including a display panel on which an image is displayed, an anti-reflection polarizing film disposed on the display panel, and a cover window disposed on the anti-reflection polarizing film and provided with a plurality of light path conversion protrusions on a lower surface thereof.

In another aspect of the present disclosure, there is provided display device, comprising: a display panel on which an image is displayed; an anti-reflection polarizing film disposed on the display panel; a light path conversion layer including a plurality of light path conversion protrusions disposed on the anti-reflection polarizing film and provided with a plurality of light path conversion protrusions on a lower surface towards the anti-reflection polarizing film and a cover window disposed on the light path conversion layer.

In a further aspect of the present disclosure, there is provided a display device including a display panel displaying an image, comprising an anti-reflection polarizing film disposed on the display panel; a cover window including a plurality of light path conversion protrusions disposed on the anti-reflection polarizing film; and a plurality of space portions between each of the plurality of light path conversion protrusions of the cover window, wherein a difference in a refractive index between the space portions and the light path conversion protrusions is configured to suppress reflection of external light incident from 0 to 90 degrees with respect to a top surface of the display panel.

According to an aspect of the present disclosure, the anti-reflection polarizing film may include a linear polarizer and a circular polarizer.

According to another aspect of the present disclosure, the light path conversion protrusions may include a quadrangular pyramid shape or a conical shape.

According to another aspect of the present disclosure, there is provided a display device, including a display panel on which an image is displayed, an anti-reflection polarizing film disposed on the display panel, a light path conversion layer disposed on the anti-reflection polarizing film and provided with a plurality of light path conversion protrusions on a lower surface thereof, and a cover window disposed on the light path conversion layer.

According to an aspect of the present disclosure, the anti-reflection polarizing film may include a linear polarizer and a circular polarizer.

According to another aspect of the present disclosure, the light path conversion protrusions may include a quadrangular pyramid shape or a conical shape.

According to still another aspect of the present disclosure, the light path conversion protrusions may be formed on a lower surface of a resin portion constituting the light path conversion layer.

According to yet still another aspect of the present disclosure, the light path conversion layer may include a resin portion, a plurality of light path conversion protrusions provided on a lower surface of the resin portion, and an optical film disposed under the light path conversion protrusions.

According to still yet another aspect of the present disclosure, the display panel may include an organic light emitting display (OLED), a liquid crystal display (LCD), and a plasma display panel (PDP).

According to still another aspect of the present disclosure, there is provided a method of fabricating a display device, including: forming a display panel on which an image is displayed; forming an anti-reflection film on the display panel; and forming a cover window provided with a plurality of light path conversion protrusions on the anti-reflection film.

According to an aspect of the present disclosure, said forming the anti-reflection film may include forming a circular polarizer and forming a linear polarizer.

According to another aspect of the present disclosure, said forming a plurality of light path conversion protrusions on the cover window may include forming the light path conversion protrusions in a quadrangular pyramid shape or a conical shape.

According to still another aspect of the present disclosure, said forming a plurality of light path conversion protrusions on the cover window may include etching a lower surface of the cover window.

According to a display device according to the present disclosure, it has the following effects.

A display device according to the present disclosure may suppress reflection of external light with respect to light incident at a viewing angle, thereby improving contrast and visibility.

Furthermore, in a display device according to the present disclosure, light path conversion protrusions may be formed on a lower surface of a cover window or a light path conversion layer having a plurality of light path conversion protrusions may be provided between the cover window and the anti-reflection polarizing film to convert view angle incident light into the same incident light as that of front incident light, thereby preventing reflection of incident light from a viewing angle as well as front incident light.

In addition, a display device according to the present disclosure may reduce reflectance of incident light from a viewing angle, thereby improving color shift.

BRIEF DESCRIPTION OF THE DRAWINGS

The accompanying drawings, which are included to provide a further understanding of the disclosure and are incorporated in and constitute a part of this specification, illustrate aspects of the disclosure and together with the description serve to explain the principles of the disclosure.

In the drawings:

FIGS. 13A and 13B are views illustrating a luminance and a color distribution of an incident light source at a viewing angle of 45 degrees in display devices according to the present disclosure, wherein FIG. 13A is a view illustrating a luminance of an incident light source at a viewing angle of 45 degrees, and FIG. 13B is a view illustrating a color distribution of an incident light source at a viewing angle of 45 degrees;

FIGS. 14A and 14B are views illustrating a luminance and a color distribution after an incident light source at a viewing angle of 45 degrees has converged at 90 degrees through light path conversion protrusions, in a display device according to the present disclosure, wherein FIG. 14A is a view illustrating a luminance after the incident light source at a viewing angle of 45 degrees has converged at 90 degrees, and FIG. 14B is a view illustrating a color distribution after the incident light source at a viewing angle of 45 degrees has converged at 90 degrees.

DETAILED DESCRIPTION OF THE DISCLOSURE

Figure 1:
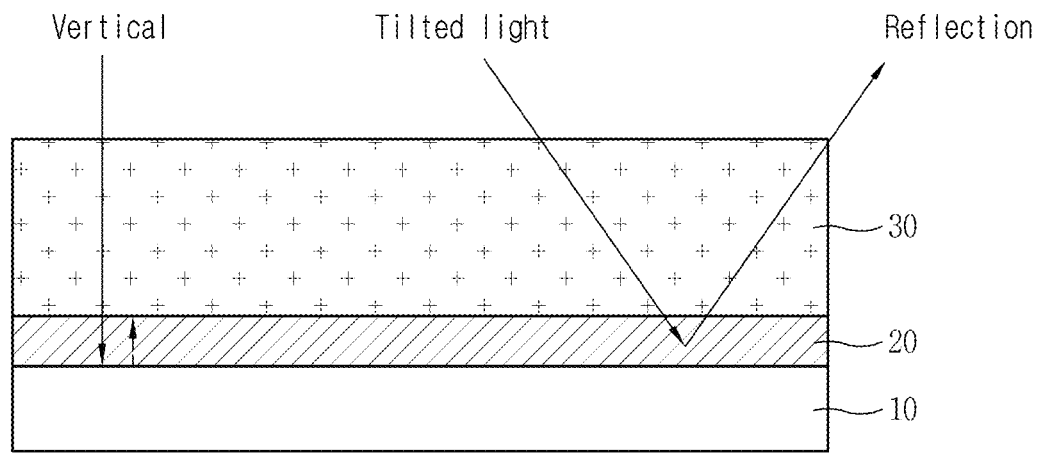
FIG. 1 is a cross-sectional view schematically illustrating a display device according to the related art.
Figure 2:
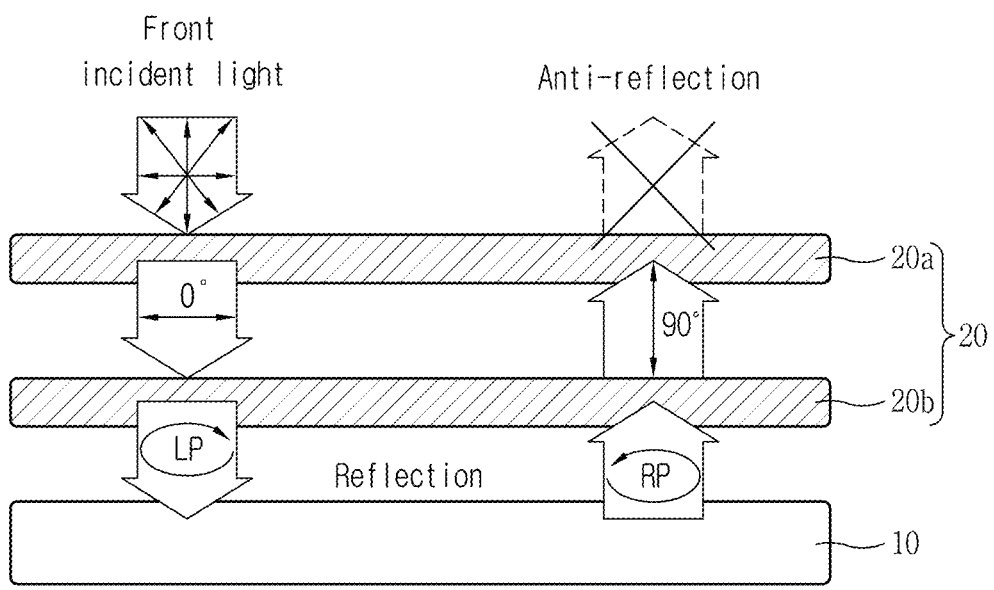
FIG. 2 is a view schematically illustrating a light path of front incident light in a display device according to the prior art.
Figure 3:
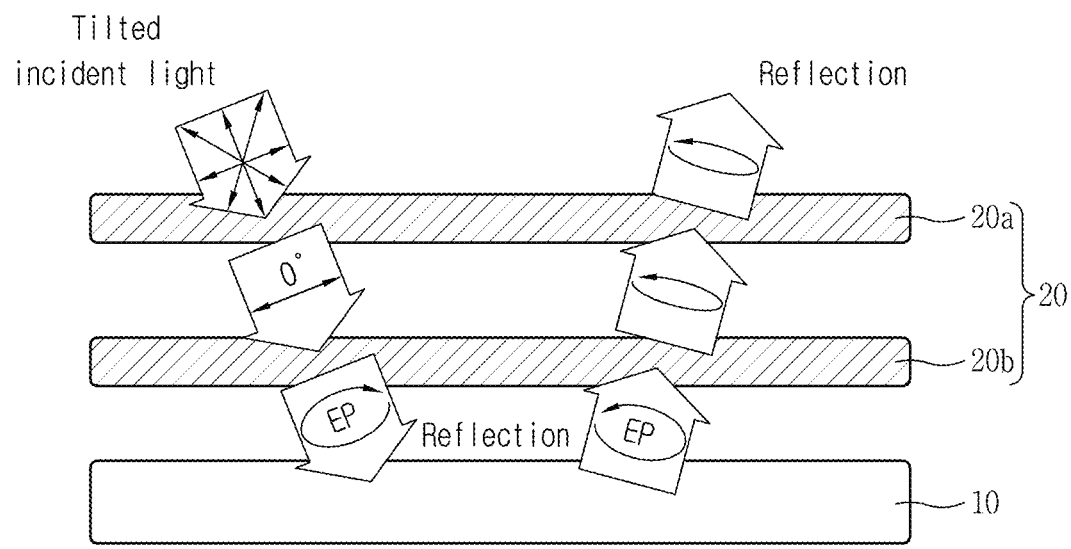
FIG. 3 is a view schematically illustrating a light path of tilted incident light in a display device according to the related art.

Hereinafter, aspects of the present disclosure will be described in detail with reference to the accompanying drawings. The widths and thicknesses of layers or regions illustrated in the accompanying drawings are somewhat exaggerated for clarity of the specification. The same reference numerals designate the same elements throughout the specification.

Figure 4:
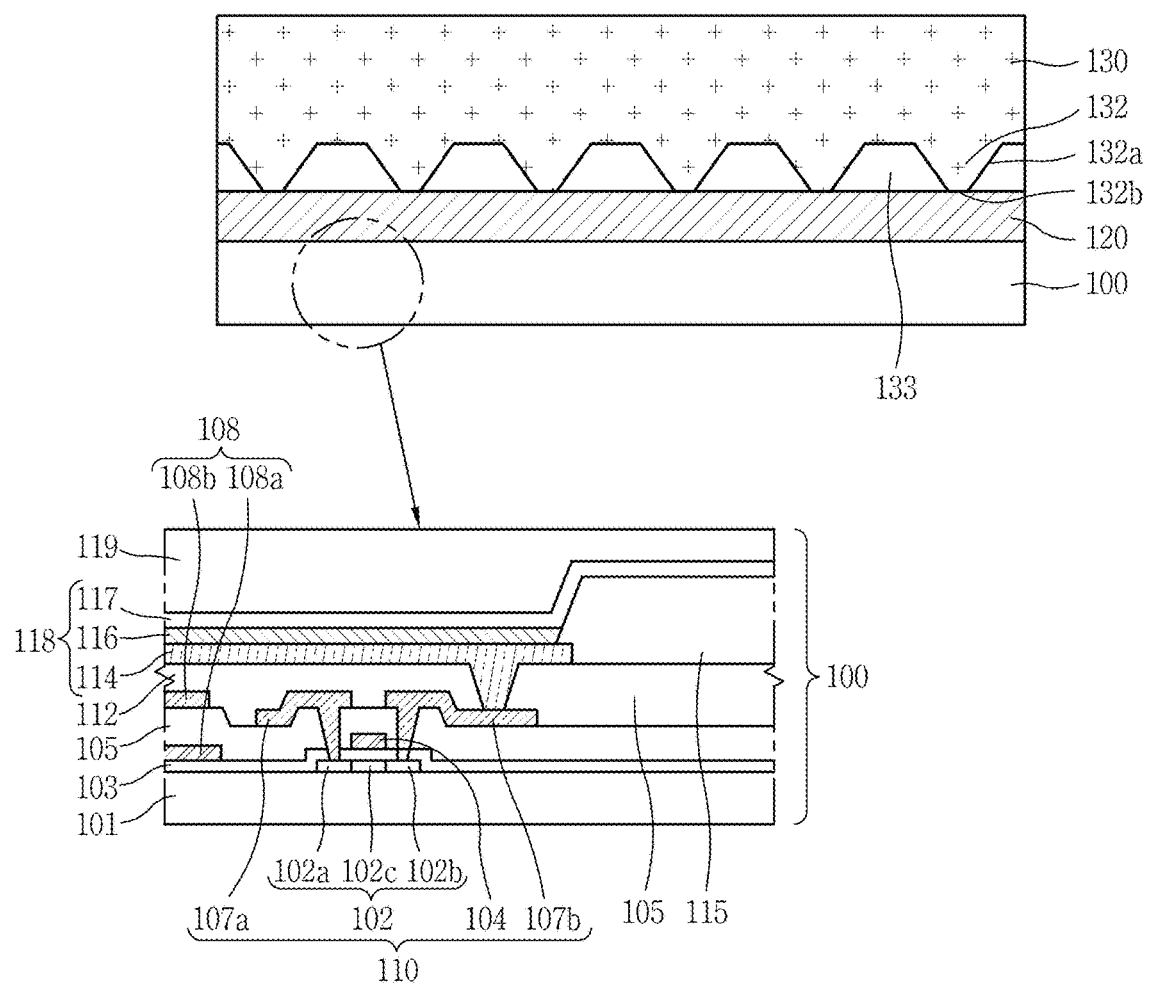
FIG. 4 is a cross-sectional view schematically illustrating a display device according to an aspect of the present disclosure.

FIG. 4 is a cross-sectional view schematically illustrating a display device according to an aspect of the present disclosure.

Referring to FIG. 4, a display device according to an aspect of the present disclosure includes a display panel 100 on which an image is displayed, an anti-reflection polarizing film 120 disposed on the display panel 100, and a cover window 130 disposed on the anti-reflection polarizing film 120 and provided with a plurality of light path conversion protrusions 132 on a lower surface thereof.

Here, the display device may include an organic light emitting display (OLED), a liquid crystal display (LCD), and a plasma display panel (PDP).

According to the present disclosure, among these display devices, an organic light emitting display (OLED) will be described as an example.

Figure 5:
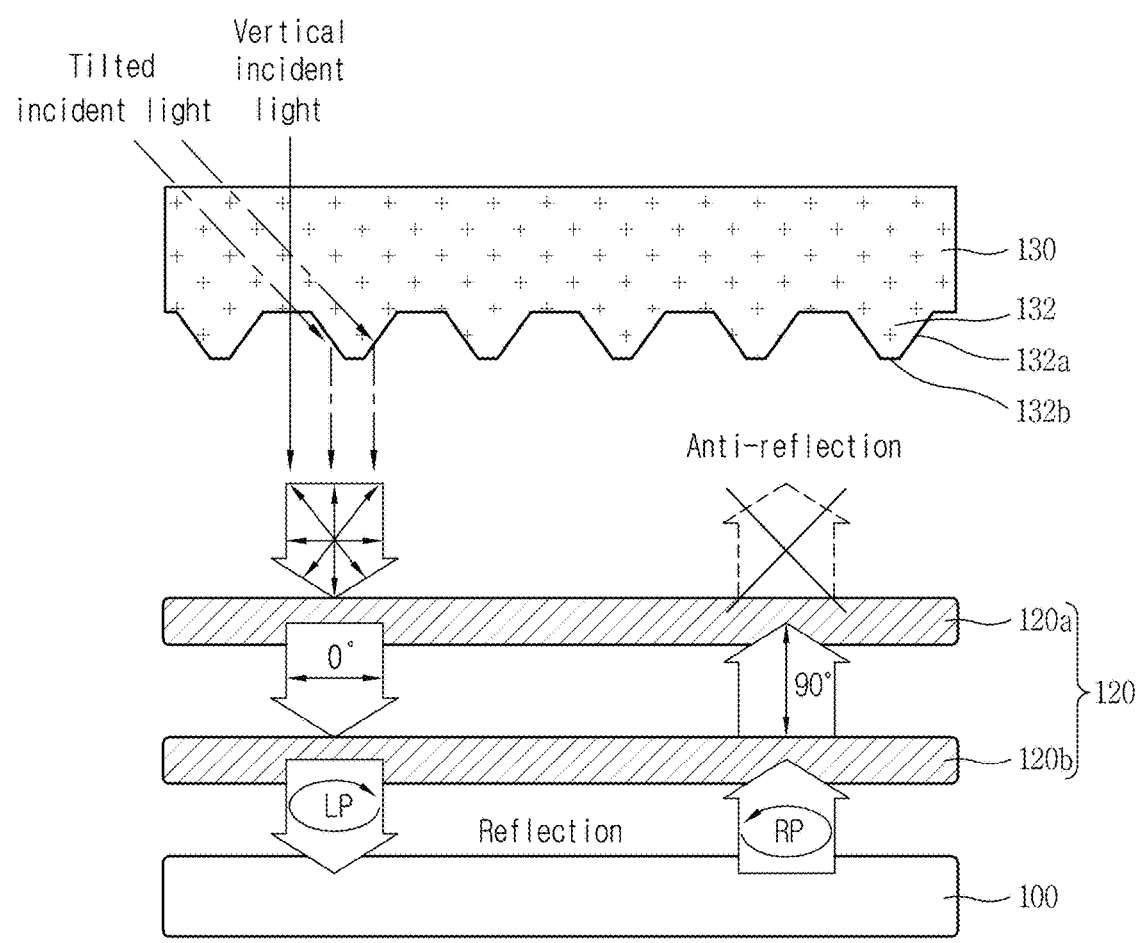
FIG. 5 is a view schematically illustrating the light paths of front and tilted incident light in a display device according to an aspect of the present disclosure.

The anti-reflection polarizing film 120 is a polarizer for preventing incident light from being reflected, and the anti-reflection polarizing film 120 is composed of a linear polarizer (refer to reference numeral 120a in FIG. 5) and a circular polarizer (refer to reference numeral 120b in FIG. 5).

Furthermore, each of the light path conversion protrusions 132 is formed to be spaced apart from each other by a predetermined distance on a lower surface of the cover window 130. Here, an angle of the light path conversion protrusion 132 may be about 45 degrees, which can be the most optimal angle for deflecting most of the external light. However, an angle of the light path conversion protrusion 132 may not be limited to this, and the angle may be adjusted under the circumstances.

In addition, a size of the light path conversion protrusion 132 may be considered to be the same as a size of the subpixel, but the size of the light path conversion protrusion 132 may not be restricted and adjusted under the circumstances.

Moreover, each of the light path conversion protrusions 132 may have a quadrangular pyramid shape or a conical shape. Furthermore, the light path conversion protrusion 132 includes an inclined surface 132a and a bottom surface 132b, and the bottom surface 132b may be flat so as to be well bonded to the anti-reflection polarizing film 120.

Furthermore, the light path conversion protrusion 132 is disposed toward the display panel 100 and has a gradually reducing width toward the bottom surface 132b.

Conversely, if the light path conversion protrusion 132 is formed to have a wider shape toward the display panel 100, and light is incident at 45 degrees, light may not be vertically deflected at 90 degrees, but deflected in a direction close to 0 degree, thereby causing light to spread and further worsening reflection and scattering.

Accordingly, as in the present disclosure, the light path conversion protrusion 232 is formed to have a gradually reducing width toward the display panel 100 such that light incident at 45 degrees is vertically deflected at 90 degrees.

Furthermore, a space portion 133 including an air layer having a refractive index (n) of 1 is formed between the light path conversion protrusions 132 and the anti-reflection polarizing film 120. Here, refraction of light appears due to a difference in refractive index between media such as the light path conversion protrusions 132 and the space portion 133, namely, the light path conversion layer 130 and the air.

In addition, a medium layer (not shown) having a refractive index smaller than that of the light path conversion protrusion 132 may be filled in the space portion 133. Here, a refractive index of the medium layer (not shown) in a range of 1.0 to 1.4 may be applicable.

Here, since a refractive index (n) of the optical path changing layer is about 1.5 to 1.7 and a refractive index of the air layer is 1.0, a difference in refractive index between the light path conversion layer and the air layer, namely, the space portion 133, may be about 0.5 to 0.7.

Accordingly, a refractive index of the light path conversion protrusion 132 may be larger than that of the space portion 133.

On the other hand, the display panel 100 includes a thin film transistor 110, a capacitor 108, and an organic light emitting device 118 disposed on a substrate 101.

Specifically considering elements included in the display panel 100, the substrate 101 is formed of an insulating substrate made of glass, quartz, ceramic, plastic or the like, and includes the thin film transistor 110 disposed on the substrate 101 includes an active layer 102, a gate electrode 104, a source electrode 107a, and a drain electrode 107b.

The active layer 102 may be formed of a semiconductor material such as amorphous silicon or poly silicon, but may not be limited thereto, and may be also formed of an oxide semiconductor. The active layer 102 may include a channel region 102c and source and drain regions 102a, 102b doped with ionic impurities at an outside of the channel region 102c.

A gate electrode 104 is disposed on the active layer 102, and a gate insulating layer 105 is disposed between the active layer 102 and the gate electrode 104. Here, the gate electrode 104 may include one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W) or copper (Cu), and formed as a single layer or a multilayer.

An interlayer insulating film 105 is disposed on the gate electrode 104, and source and drain electrodes 107a, 107b connected to the source and drain regions 102a, 102b, respectively, on the active layer 102 are disposed by interposing the interlayer insulating film 105 therebetween.

The source and drain electrodes 107a, 107b may include one or more metal materials of aluminum (Al), platinum (Pt), palladium (Pd), silver (Ag), magnesium (Mg), gold (Au), nickel (Ni), neodymium iridium (Ir), chromium (Cr), lithium (Li), calcium (Ca), molybdenum (Mo), titanium (Ti), tungsten (W) or copper (Cu), and may be formed as a single layer or a multilayer.

A planarization layer 112 having a via hole electrically connecting one of the source and drain electrodes 107a, 107b to a pixel electrode 114 is formed on the source and drain electrodes 107a, 107b.

The capacitor 108 includes a lower electrode 108a formed of the same material as that of the gate electrode 104 and an upper electrode 108b formed of the same material as that of the source and drain electrodes 107a, 107b.

An organic light emitting device 118 is disposed on the planarization layer 112, and the organic light emitting device 118 includes a pixel electrode 114, an organic light emitting layer 116, and a counter electrode 117 that are sequentially arranged. Here, a pixel defining layer 115 is disposed to cover an edge of the pixel electrode 114.

A sealing layer 119 is formed on the entire surface of the substrate including the organic light emitting device 118 to seal the organic light emitting device 118.

According to an aspect of the present disclosure, the pixel electrode 114 may be an anode and the counter electrode 117 may be a cathode. However, the present disclosure may not be limited to such a configuration, and the pixel electrode 114 may be a cathode and the counter electrode 117 may be an anode.

The pixel electrode 114 included in the organic light emitting device 118 of the present aspect may be a reflective electrode, and may include a reflective layer formed of Ag, Mg, Al, Pt, Pd, Au, Ni, Nd, Ir, Cr, of a compound thereof, and a transparent or semi-transparent electrode layer formed on the reflective layer.

The transparent or semi-transparent electrode layer may include at least one of indium tin oxide (ITO), indium zinc oxide (IZO), zinc oxide (ZnO), indium oxide ($In_2O_3$), indium gallium oxide (IGO), or aluminum zinc oxide (AZO).

The counter electrode 117 disposed to face the pixel electrode 114 may be a transparent electrode, and formed of a metal thin film having a low work function including Li, Ca, LiF/Ca, LiF/Al, Al, Ag, Mg, and a compound thereof. Furthermore, an auxiliary electrode layer or a bus electrode may be further formed of a material for forming a transparent electrode such as ITO, IZO, ZnO and $In_2O_3$ on the metal thin film.

Therefore, the counter electrode 117 may transmit light emitted from the organic light emitting layer 116.

The organic light emitting layer 116 may be disposed between the pixel electrode 114 and the counter electrode 117, and the organic light emitting layer 116 may be a low molecular organic material or a high molecular organic material.

An intermediate layer such as a hole transport layer (HTL), a hole injection layer (HIL), an electron transport layer (ETL), an electron injection layer (EIL), and the like in addition to the organic light emitting layer 116 may be selectively disposed between the pixel electrode 114 and the counter electrode 117.

Light emitted from the organic light emitting layer 116 may be a front light emitting type which is directly reflected or reflected by the pixel electrode 114 configured with a reflective electrode, and emitted toward the counter electrode 117.

FIG. 5 is a view schematically illustrating the light paths of front and tilted incident light in a display device according to an aspect of the present disclosure.

Referring to FIG. 5, in case of a display device according to an aspect of the present disclosure, light incident on the front surface is linearly polarized at 0 degree while passing through the linear polarizer 120a, and converted into left-handed circularly polarized light while passing through the circular polarizer 120b therebelow.

Then, the left-handed circularly polarized light is reflected from the display panel 100 and converted into right-handed circularly polarized light.

Furthermore, the converted right-handed circularly polarized light is converted into 90-degree linearly polarized light while passing through the circular polarizer 120b, and finally absorbed through the linear polarizer 120a to prevent reflection. Here, the linear polarizer 120a has an optical characteristic of transmitting only 0-degree light but absorbing 90-degree light.

Therefore, even if a part of light incident on a front surface in a display device according to an aspect of the present disclosure is reflected within the display device, the reflected light is substantially absorbed into an inside of the display device, namely, the linear polarizer 120a, to finally prevent reflection to an outside of the display device.

Furthermore, referring to FIG. 5, tilted incident light that is incident from a tilted direction having a viewing angle of less than 90 degrees is refracted through an inclined surface 132a of the light path conversion protrusions 132 formed on a lower surface of the cover window 130, and converted into vertical incident light at 90 degrees. In other words, the tilted incident light is refracted by the light path conversion protrusions 132 and converted into the same incident light as the vertical incident light.

The tilted incident light converted into the vertical incident light is linearly polarized at 0 degree while passing through the linear polarizer 120a, and converted into left-handed circularly polarized light while passing through the circular polarizer 120b therebelow.

Then, the left-handed circularly polarized light is reflected from the display panel 100 and converted into right-handed circularly polarized light.

Furthermore, the converted right-handed circularly polarized light is converted into 90-degree linearly polarized light while passing through the circular polarizer 120b, and finally absorbed through the linear polarizer 120a to prevent reflection.

Therefore, even if tilted incident light is reflected within the display device similar to the vertical incident light, the reflected light is substantially absorbed into an inside of the display device, namely, the linear polarizer 120a, to prevent reflection to an outside of the display device.

As described above, tilted incident light may be converted into vertical incident light through the light path conversion protrusions 132 provided in the cover window 130, thereby preventing reflection of both the vertical and tilted incident light.

Figure 6:
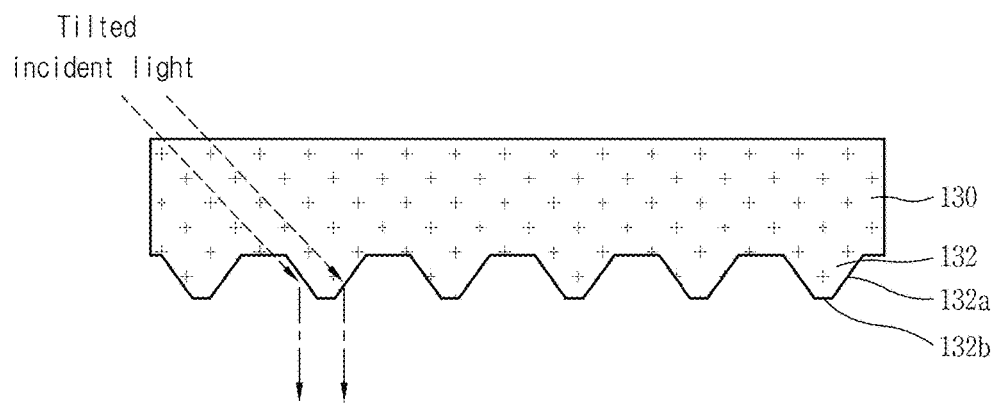
FIG. 6 is a view schematically illustrating a cover window provided with a plurality of light path conversion protrusions in a display device according to an aspect of the present disclosure.

FIG. 6 is a view schematically illustrating a cover window provided with a plurality of light path conversion protrusions in a display device according to an aspect of the present disclosure.

Figure 7:
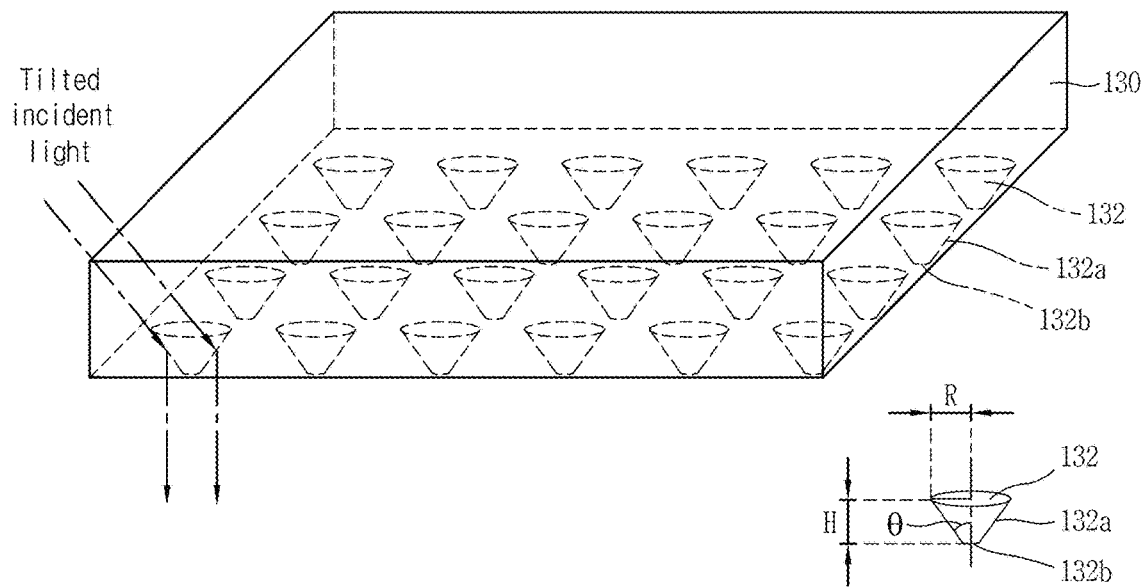
FIG. 7 is a view stereoscopically illustrating cone-shaped light path conversion protrusions provided on a lower surface of a cover window in a display device according to an aspect of the present disclosure.

FIG. 7 is a view stereoscopically illustrating cone-shaped light path conversion protrusions provided on a lower surface of a cover window in a display device according to an aspect of the present disclosure.

Referring to FIGS. 6 and 7, a lower surface of the cover window 130 is etched to have a three-dimensional conical shape, and a plurality of light path conversion protrusions 132 are formed to be spaced apart from each other by a predetermined distance on a lower surface of the cover window 130.

Each of the light path conversion protrusions 132 has an inclined surface 132 and a bottom surface 132b. The inclined plane 132a may be inclined at a predetermined angle ($\theta$), for example, about 45 degrees, from the center of the light path conversion protrusion 132, and the bottom surface 132b may be flat so as to be well bonded to the anti-reflection polarizing film 120 (shown in FIG. 5).

Furthermore, a radius (R) and a height (H) of the light path conversion protrusion 132 may not be limited to a predetermined size, and may be designed to be appropriately adjusted according to the design size of the product.

On the other hand, FIGS. 8A through 8D are fabrication process views for explaining a fabrication method of a display device according to an aspect of the present disclosure.

Figure 8A:
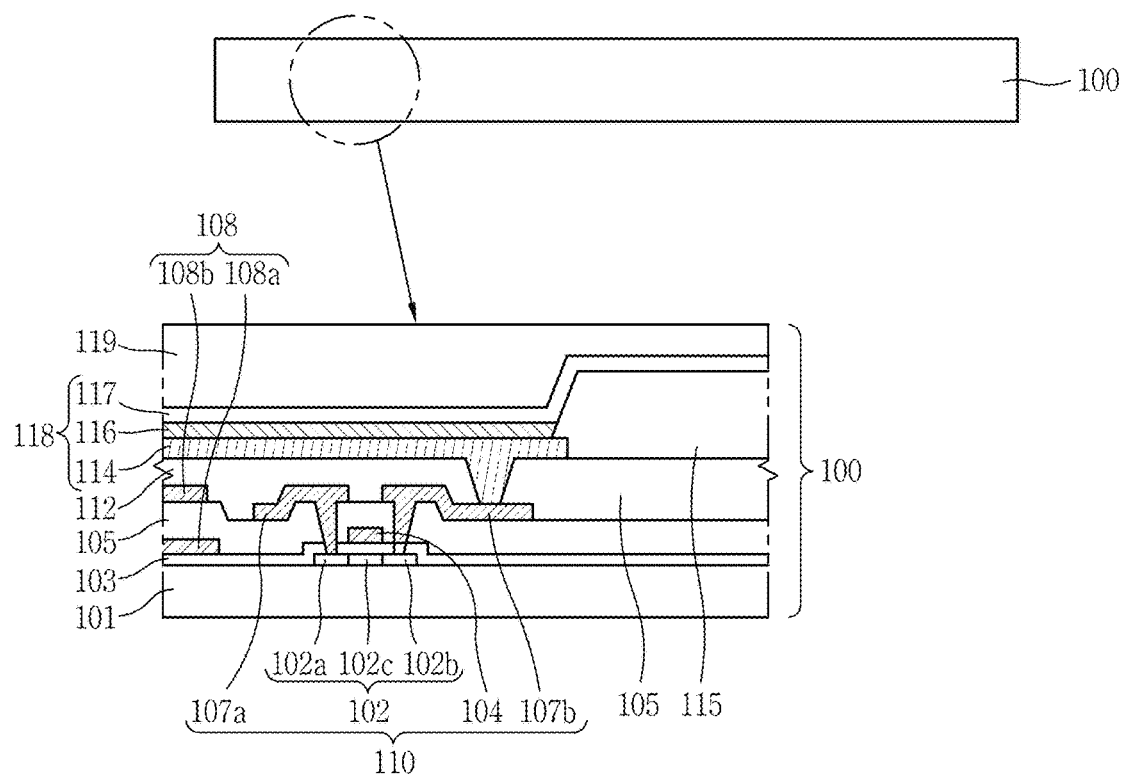
FIGS. 8A through 8D are fabrication process views for explaining a fabrication method of a display device according to an aspect of the present disclosure.

Describing a fabrication method of a display device according to an aspect of the present disclosure, first, a display panel 100 is formed as illustrated in FIG. 8A. Here, the display panel 100 may include an organic light emitting display panel (OLED), a liquid crystal display panel (LCD), and a plasma display panel (PDP).

According to the present disclosure, among these display devices, an organic light emitting display (OLED) will be described as an example.

Specifically describing a method of manufacturing elements constituting the display panel 100 in detail, an active layer 102 is formed on a substrate 101. Here, the substrate 101 is formed of an insulating substrate made of glass, quartz, ceramic, plastic, or the like.

Furthermore, the active layer 102 may be formed of a semiconductor material such as amorphous silicon or poly silicon, but may not be necessarily limited to this, and may be formed of an oxide semiconductor. The active layer 102 may include a channel region 102c and source and drain regions 102a, 102b doped with ionic impurities outside the channel region 102c.

Subsequently, a gate electrode 104 is formed on the active layer 102, and a gate insulating layer 105 is formed between the active layer 102 and the gate electrode 104. Here, the gate electrode 104 may include at least one of aluminum (Al), platinum (Pt), palladium (Pd), silver (Ag), magnesium (Mg), gold (Au), nickel (Ni), neodymium iridium (Ir), chromium (Cr), lithium (Li), calcium (Ca), molybdenum (Mo), titanium (Ti), tungsten (W) or copper (Cu), and may be formed as a single layer or a multilayer. Here, at the time of forming the gate electrode 104, a lower electrode 108a of the capacitor 108 made of the same material as the gate electrode 104 is concurrently formed.

Then, an interlayer insulating film 105 is formed on the gate electrode 104, and a source electrode and a drain electrode 107a, 107b connected to the source region and the drain region 102a, 102b, respectively, on the active layer 102 are formed by interposing the interlayer insulating film 105 therebetween. At this time, when the source and drain electrodes 107a, 107b are formed, an upper electrode 108b of the capacitor 108 made of the same material as the source and drain electrodes 107a, 107b is concurrently formed.

As described above, a thin film transistor 110 including the gate electrode 104, the gate insulating layer 105, the active layer 102, the source electrode and the drain electrodes 107a, 107b is formed.

Here, the source and drain electrodes 107a, 107b may include one or more metal materials of aluminum (Al), platinum (Pt), palladium (Pd), silver (Ag), magnesium (Mg), gold (Au), nickel (Ni), neodymium iridium (Ir), chromium (Cr), lithium (Li), calcium (Ca), molybdenum (Mo), titanium (Ti), tungsten (W) or copper (Cu), and may be formed as a single layer or a multilayer.

Subsequently, a planarization layer 112 having a via hole electrically connecting one of the source and drain electrodes 107a, 107b to a pixel electrode 114 is formed on the source and drain electrodes 107a, 107b.

Then, a pixel electrode 114 electrically connected to the drain electrode 107b is formed on the planarization layer 112, and then a pixel defining layer 115 is formed to cover an edge of the pixel electrode 114.

Subsequently, the organic light emitting layer 116 and the counter electrode 117 are deposited on the pixel electrode 114 to form the organic light emitting element 118.

According to an aspect of the present disclosure, the pixel electrode 114 may be an anode and the counter electrode 117 may be a cathode. However, the present disclosure may not be limited to such a configuration, and the pixel electrode 114 may be a cathode and the counter electrode 117 may be an anode.

The pixel electrode 114 included in the organic light emitting device 118 of the present aspect may be a reflective electrode, and may include a reflective layer formed of Ag, Mg, Al, Pt, Pd, Au, Ni, Nd, Ir, Cr, or a compound thereof, and a transparent or semi-transparent electrode layer formed on the reflective layer.

The transparent or semi-transparent electrode layer may include at least one of indium tin oxide (ITO), indium zinc oxide (IZO), zinc oxide (ZnO), indium oxide ($In_2O_3$), indium gallium oxide (IGO), or aluminum zinc oxide (AZO).

The counter electrode 117 disposed to face the pixel electrode 114 may be a transparent electrode, and formed of a metal thin film having a low work function including Li, Ca, LiF/Ca, LiF/Al, Al, Ag, Mg, and a compound thereof. Furthermore, an auxiliary electrode layer or a bus electrode may be further formed of a material for forming a transparent electrode such as ITO, IZO, ZnO and $In_2O_3$ on the metal thin film. Here, the counter electrode 117 may transmit light emitted from the organic light emitting layer 116.

The organic light emitting layer 116 may be disposed between the pixel electrode 114 and the counter electrode 117, and the organic light emitting layer 116 may be a low molecular organic material or a high molecular organic material.

Furthermore, an intermediate layer such as a hole transport layer (HTL), a hole injection layer (HIL), an electron transport layer (ETL), an electron injection layer (EIL), and the like in addition to the organic light emitting layer 116 may be selectively disposed between the pixel electrode 114 and the counter electrode 117.

Furthermore, light emitted from the organic light emitting layer 116 may be a top light emitting type which is directly reflected or reflected by the pixel electrode 114 configured with a reflective electrode, and emitted toward the counter electrode 117.

Then, a sealing layer 119 is formed on the entire surface of the substrate including the organic light emitting device 118 to seal the organic light emitting device 118, thereby completing the process of forming an organic light emitting display panel as the display panel 100.

Figure 8B:
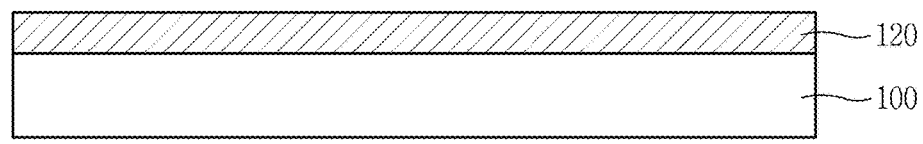

Subsequently, as illustrated in FIG. 8B, the anti-reflection polarizing film 120 is bonded to an upper portion of the display panel 100. Here, the anti-reflection polarizing film 120 is a polarizer for preventing incident light from being reflected, and the anti-reflection polarizing film 120 may be composed of a linear polarizer (refer to reference numeral 120a in FIG. 5) and a circular polarizer (refer to reference numeral 120b in FIG. 5).

Figure 8C:
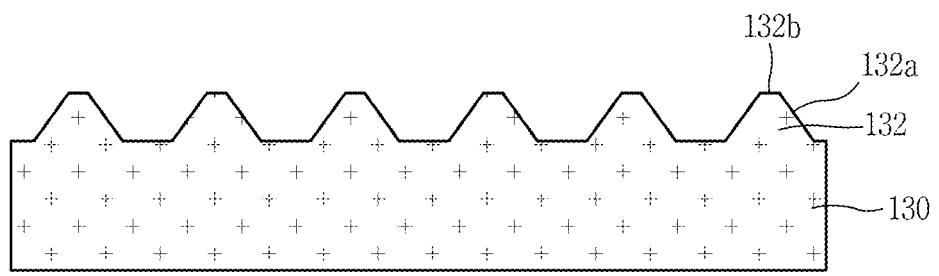

Then, as illustrated in FIG. 8C, an upper surface of the cover window 130 is selectively etched by a predetermined thickness through a mask process and an etching process to form a plurality of light path conversion protrusions 132 spaced apart from each other by a predetermined distance. Here, each of the light path conversion protrusions 132 may have a quadrangular pyramid shape or a conical shape. Furthermore, the light path conversion protrusion 132 includes an inclined surface 132a and a bottom surface 132b, and the bottom surface 132b may be flat so as to be well bonded to the anti-reflection polarizing film 120.

Figure 8D:
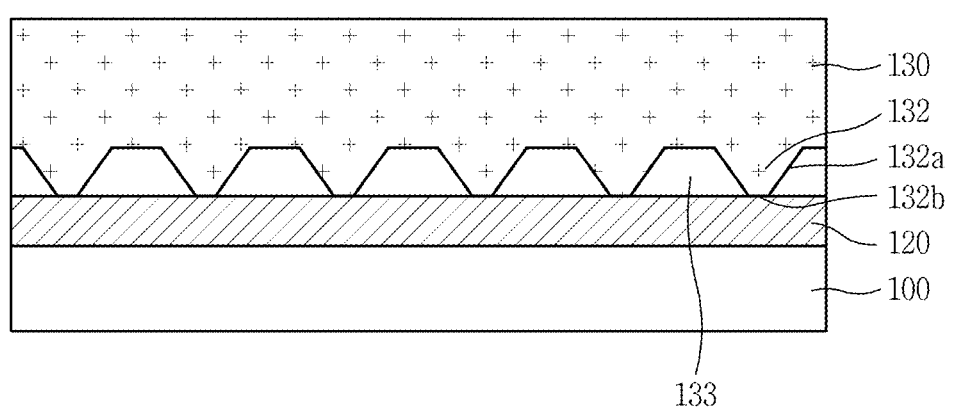

Subsequently, as illustrated in FIG. 8D, the cover window 130 is disposed on and bonded to the anti-reflection polarizing film 120 to complete a display device fabrication process according to an aspect of the present disclosure. Here, the bottom surface 132b of the light path conversion protrusion 132 of the cover window 130 is brought into contact with and bonded to the anti-reflection polarizing film 120.

Furthermore, a space portion 133 including an air layer having a refractive index (n) of 1 is formed between the light path conversion protrusions 132 and the anti-reflection polarizing film 120. Here, refraction of light due to a difference in refractive index between the light path conversion layer 130 and the air appears between the light path conversion protrusions 132 and the space portion 133.

In addition, a medium layer (not shown) having a refractive index smaller than that of the light path conversion protrusion 132 may be filled in the space portion 133. Here, a refractive index of the medium layer (not shown) in a range of 1.0 to 1.4 may be applicable.

Here, since a refractive index (n) of the optical path changing layer is about 1.5 to 1.7 and a refractive index of the air layer is 1.0, a difference in refractive index between the light path conversion layer and the air layer, namely, the space portion 133, may be about 0.5 to 0.7.

Accordingly, a refractive index of the light path conversion protrusion 132 may be larger than that of the space portion 233.

Meanwhile, a display device according to another aspect of the present disclosure will be described with reference to FIG. 9.

Figure 9:
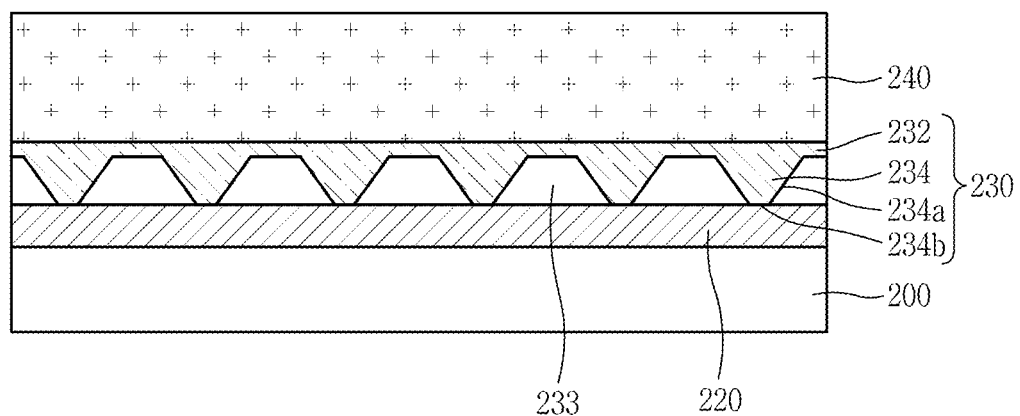
FIG. 9 is a cross-sectional view schematically illustrating a display device according to another aspect of the present disclosure.

FIG. 9 is a cross-sectional view schematically illustrating a display device according to another aspect of the present disclosure.

Referring to FIG. 9, a display device according to another aspect of the present disclosure includes a display panel 200 on which an image is displayed, an anti-reflection polarizing film 220 disposed on the display panel 200, a light path conversion layer 230 disposed on the anti-reflection polarizing film 220 and provided with a plurality of light path conversion protrusions 234 on a lower surface towards the anti-reflection polarizing film 220, and a cover window 240 disposed on the light path conversion layer 230.

Here, the display device may include an organic light emitting display (OLED), a liquid crystal display (LCD), and a plasma display panel (PDP).

According to another aspect of the present disclosure, among these display devices, the organic light emitting display (OLED) will be also described as an example.

The anti-reflection polarizing film 220 is a polarizer for preventing incident light from being reflected, and the anti-reflection polarizing film 220 may include a linear polarizer (refer to reference numeral 120a in FIG. 5) and a circular polarizer (refer to reference numeral 120b in FIG. 5).

In particular, the light path conversion protrusion 234 according to another aspect of the present disclosure is not integrally formed on a lower surface of the cover window 240 as described in an aspect of the present disclosure (refer to FIG. 4), but formed on the light path conversion layer 230 separated from the cover window 240.

Furthermore, the light path conversion layer 230 includes a resin portion 232, and a plurality of light path conversion protrusions 234 formed to be spaced apart from each other by a predetermined distance on a lower surface of the resin portion 232.

Moreover, each of the light path conversion protrusions 234 may have a quadrangular pyramid shape or a conical shape. Furthermore, the light path conversion protrusion 234 includes an inclined surface 234a and a bottom surface 234b, and the bottom surface 234b may be flat so as to be well bonded to the anti-reflection polarizing film 220.

Furthermore, the light path conversion protrusion 234 is disposed toward the display panel 200 and configured to have a gradually reducing width toward the bottom surface 234b.

Here, in case where the light path conversion protrusion 234 is formed to have a wider shape toward the display panel 200 and light is incident at 45 degrees, light may not be vertically deflected at 90 degrees, but deflected in a direction close to 0 degree, thereby causing light to spread and further worsening reflection and scattering.

Accordingly, as in the present disclosure, the light path conversion protrusion 234 should be formed to have a gradually reducing width toward the display panel 100 such that light incident at 45 degrees is vertically deflected at 90 degrees.

Furthermore, a space portion 233 including an air layer having a refractive index (n) of 1 is formed between the light path conversion protrusions 234 and the anti-reflection polarizing film 220. Here, refraction of light appears between the light path conversion protrusions 234 and the space portion 233 due to a difference in refractive index between media, namely, the light path conversion layer 230 and the air.

In addition, a medium layer (not shown) having a refractive index smaller than that of the light path conversion protrusion 234 may be filled in the space portion 233. Here, a refractive index of the medium layer (not shown) in a range of 1.0 to 1.4 may be applicable.

Here, since a refractive index (n) of the optical path changing layer is about 1.5 to 1.7 and a refractive index of the air layer is 1.0, a difference in refractive index between media, namely, between the light path conversion layer and the air layer, namely, the space portion 233, may be about 0.5 to 0.7.

Accordingly, a refractive index of the light path conversion protrusion 234 may be larger than that of the space portion 233.

As described above, in case of a display device according to another aspect of the present disclosure, light incident on the vertical surface is linearly polarized at 0 degree while passing through a linear polarizer (refer to reference numeral 120a in FIG. 5) within the anti-reflection polarizing film 220, and converted into left-handed circularly polarized light while passing through a circular polarizer (refer to reference numeral 120b in FIG. 5).

Then, the left-handed circularly polarized light is reflected from the display panel 200 and converted into right-handed circularly polarized light.

Furthermore, the converted right-handed circularly polarized light is converted into 90-degree linearly polarized light while passing through the circular polarizer (not shown), and finally absorbed through the linear polarizer 120a to prevent reflection.

Therefore, even if a part of light incident from a vertical direction to the surface in a display device according to an aspect of the present disclosure is reflected within the display device, the reflected light is substantially absorbed into an inside of the display device, namely, the linear polarizer (not shown) within the anti-reflection polarizing film 220, to finally prevent reflection to an outside of the display device.

Furthermore, similar to the case of an aspect of the present disclosure, tilted incident light that is incident from a tilted direction having a viewing angle of less than 90 degrees is refracted through an inclined surface 234a of the light path conversion protrusions 234 formed on a lower surface of the light path conversion layer 230, and converted into vertical incident light at 90 degrees. In other words, the tilted incident light is refracted by the light path conversion protrusions 234 and converted into the same incident light as the vertical incident light.

The tilted incident light converted into the vertical incident light is linearly polarized at 0 degree while passing through the linear polarizer (refer to reference numeral 120a in FIG. 5) within the light path conversion layer 230, and converted into left-handed circularly polarized light while passing through the circular polarizer (refer to reference numeral 120b in FIG. 5) therebelow.

Then, the left-handed circularly polarized light is reflected from the display panel 200 and converted into right-handed circularly polarized light.

Furthermore, the converted right-handed circularly polarized light is converted into 90-degree linearly polarized light while passing through the circular polarizer (not shown), and finally absorbed through the linear polarizer (not shown) to prevent reflection.

Therefore, even if tilted incident light is reflected within the display device similar to the vertical incident light, the reflected light is substantially absorbed into an inside of the display device, namely, the linear polarizer (not shown), to prevent reflection to an outside of the display device.

As described above, the tilted incident light may be converted into the vertical incident light through the light path conversion protrusions 234 provided in the light path conversion layer 230 separated from the cover window 240, thereby preventing reflection of both the vertical and tilted incident light.

FIGS. 10A through 10D are fabrication process views for explaining a fabrication method of a display device according to an aspect of the present disclosure.

Figure 10A:
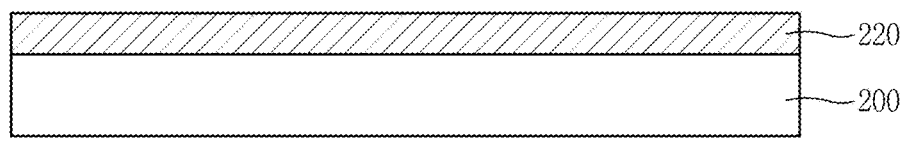
FIGS. 10A through 10D are fabrication process views for explaining a fabrication method of a display device according to another aspect of the present disclosure.

Describing a fabrication method of a display device according to still another aspect of the present disclosure, first, a display panel 100 is formed as illustrated in FIG. 10A. Here, the display panel 200 may include an organic light emitting display panel (OLED), a liquid crystal display panel (LCD), and a plasma display panel (PDP).

According to the present disclosure, among these display devices, an organic light emitting display (OLED) will be described as an example.

The display panel 200 according to still another aspect of the present disclosure has the same structure as that of the display panel 100 according to the previously described aspects of the present disclosure, and a fabrication method thereof is also the same, and thus the description of a fabrication process of the display panel 200 will be omitted.

Then, as illustrated in FIG. 10A, the anti-reflection polarizing film 220 is bonded to an upper portion of the display panel 200. Here, the anti-reflection polarizing film 220 is a polarizer for preventing incident light from being reflected, and the anti-reflection polarizing film 220 includes a linear polarizer (refer to reference numeral 120a in FIG. 5) and a circular polarizer (refer to reference numeral 120b in FIG. 5).

Figure 10B:

Subsequently, as illustrated in FIG. 10B, a resin layer 232 is prepared, and an upper surface of the resin layer 232 is selectively etched by a predetermined thickness through a mask process and an etching process to form a plurality of light path conversion protrusions 234 spaced apart from each other by a predetermined distance. Here, each of the light path conversion protrusions 234 may have a quadrangular pyramid shape or a conical shape. Furthermore, the light path conversion protrusion 234 includes an inclined surface 234a and a bottom surface 234b, and the bottom surface 234b may be flat so as to be well bonded to the anti-reflection polarizing film 220.

Figure 10C:
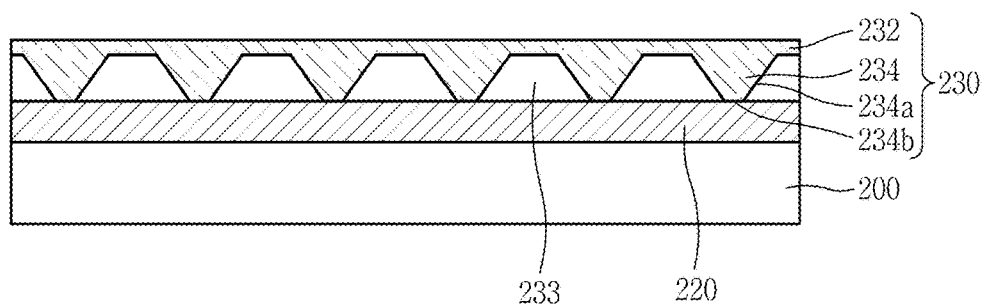

Then, as illustrated in FIG. 10C, the light path conversion layer 230 is disposed on and bonded to the anti-reflection polarizing film 220. Here, the lower surface 234 of the light path conversion protrusion 234 below the light path conversion layer 230 is brought into contact with and bonded to the anti-reflection polarizing film 220.

Figure 10D:
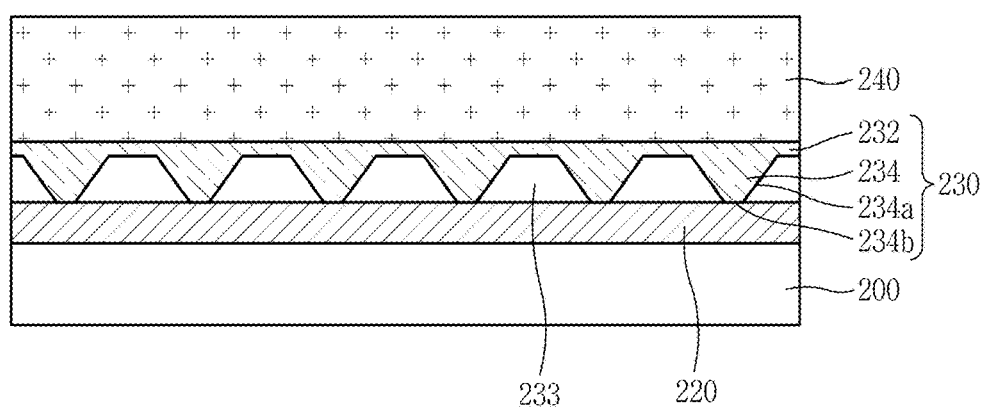

Subsequently, as illustrated in FIG. 10D, the cover window 240 is disposed at and bonded to an upper portion of the light path conversion layer 230 to complete a display device fabrication process according to another aspect of the present disclosure.

Here, a space portion 233 including an air layer having a refractive index (n) of 1 is formed between the light path conversion protrusions 232 and the anti-reflection polarizing film 220. Here, refraction of light due to a difference in refractive index between media, namely, between the light path conversion layer 130 and the air appears between the light path conversion protrusions 232 and the space portion 233.

In addition, a medium layer (not shown) having a refractive index smaller than that of the light path conversion protrusion 232 may be filled in the space portion 233. Here, a refractive index of the medium layer (not shown) in a range of 1.0 to 1.4 may be applicable.

Here, since a refractive index of the optical path changing layer is about n=1.5~1.7 and a refractive index of the air layer is 1.0, a difference in refractive index between the light path conversion layer and the air layer, namely, the space portion 233, may be about 0.5 to 0.7.

Accordingly, a refractive index of the light path conversion protrusion 232 may be larger than that of the space portion 233.

However, in case where the light path conversion protrusion is formed in a convex shape at an upper end of the display device and light is incident at 45 degrees, light may not be vertically deflected at 90 degrees, but deflected in a direction close to 0 degree, thereby further worsening reflection and scattering.

Accordingly, as in the present disclosure, the light path conversion layer, namely, the light path conversion protrusion 232 may be formed in a protruding manner toward a lower portion of the display device such that light incident at 45 degrees can be vertically deflected at 90 degrees.

Figure 11:
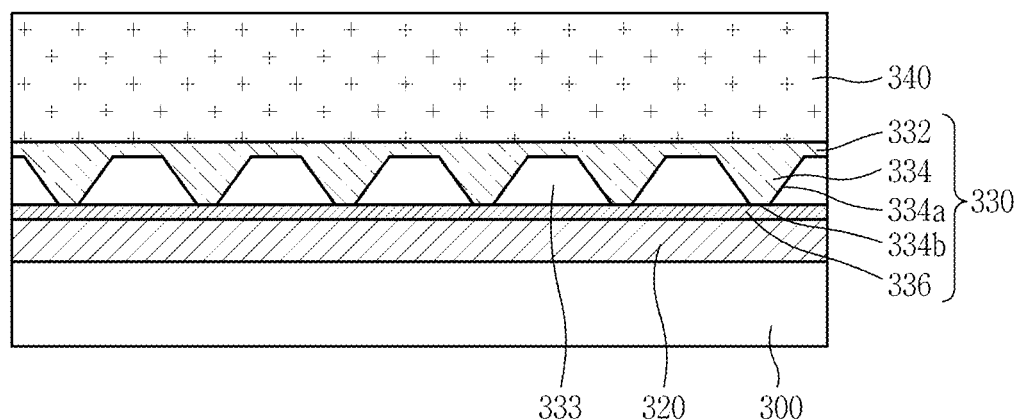
FIG. 11 is a cross-sectional view schematically illustrating a display device according to still another aspect of the present disclosure.

FIG. 11 is a cross-sectional view schematically illustrating a display device according to yet another aspect of the present disclosure.

Referring to FIG. 11, a display device according to another aspect of the present disclosure includes a display panel 300 on which an image is displayed, an anti-reflection polarizing film 320 disposed on the display panel 300, a light path conversion layer 330 disposed on the anti-reflection polarizing film 320 and provided with a plurality of light path conversion protrusions 334 on a lower surface towards the anti-reflection polarizing film 320, and a cover window 340 disposed on the light path conversion layer 330.

Here, the display device may include an organic light emitting display (OLED), a liquid crystal display (LCD), and a plasma display panel (PDP).

According to another aspect of the present disclosure, among these display devices, the organic light emitting display (OLED) will be also described as an example.

The anti-reflection polarizing film 320 is a polarizer for preventing incident light from being reflected, and the anti-reflection polarizing film 320 is configured with a linear polarizer (refer to reference numeral 120a in FIG. 5) and a circular polarizer (refer to reference numeral 120b in FIG. 5).

In particular, the light path conversion protrusion 334 according to another aspect of the present disclosure is not integrally formed on a lower surface of the cover window 340 as previously described in the aspect of the present disclosure (refer to FIG. 4), but formed on the light path conversion layer 330 separated from the cover window 340.

Furthermore, the light path conversion layer 330 includes a resin portion 332, a plurality of light path conversion protrusions 334 formed to be spaced apart from each other by a predetermined distance on a lower surface of the resin portion 332, and an optical film 336 adhered to the plurality of light path conversion protrusions 334.

Moreover, each of the light path conversion protrusions 334 may have a quadrangular pyramid shape or a conical shape. Furthermore, the light path conversion protrusion 334 includes an inclined surface 334a and a bottom surface 334b, and the bottom surface 334b may be flat so as to be well bonded to the optical film 336.

Furthermore, the light path conversion protrusion 334 is disposed toward the display panel 300 and configured to have a gradually reducing width toward the bottom surface 334b.

Here, in case where the light path conversion protrusion 334 is formed to have a wider shape toward the display panel 300 and light is incident at 45 degrees, light may not be vertically deflected at 90 degrees, but deflected in a direction close to 0 degree, thereby causing light to spread and further worsening reflection and scattering.

Accordingly, as in the present disclosure, the light path conversion protrusion 334 may be formed to have a gradually reducing width toward the display panel 100 such that light incident at 45 degrees can be vertically deflected at 90 degrees.

Furthermore, a space portion 333 including an air layer having a refractive index (n) of 1 is formed between the light path conversion protrusions 334 and the optical sheet 336. Here, refraction of light appears between the light path conversion protrusions 334 and the space portion 333 due to a difference in refractive index between media, namely, the light path conversion layer 330 and the air.

In addition, a medium layer (not shown) having a refractive index smaller than that of the light path conversion protrusion 334 may be filled in the space portion 333. Here, a refractive index of the medium layer (not shown) in a range of 1.0 to 1.4 may be applicable.

Here, since a refractive index (n) of the optical path changing layer is about 1.5 to 1.7 and a refractive index of the air layer is 1.0, a difference in refractive index between media, namely, between the light path conversion layer and the air layer, namely, the space portion 333, may be about 0.5 to 0.7.

Accordingly, a refractive index of the light path conversion protrusion 334 may be larger than that of the space portion 333.

As described above, even in case of a display device according to another aspect of the present disclosure, light incident on the vertical surface is linearly polarized at 0 degree while passing through a linear polarizer (refer to reference numeral 120a in FIG. 5) within the anti-reflection polarizing film 320, and converted into left-handed circularly polarized light while passing through a circular polarizer (refer to reference numeral 120b in FIG. 5).

Then, the left-handed circularly polarized light is reflected from the display panel 300 and converted into right-handed circularly polarized light.

Furthermore, the converted right-handed circularly polarized light is converted into 90-degree linearly polarized light while passing through the circular polarizer (not shown), and finally absorbed through the linear polarizer 120a to prevent reflection.

Therefore, even if a part of light incident from a vertical direction to the surface in a display device according to another aspect of the present disclosure is reflected within the display device, the reflected light is substantially absorbed into an inside of the display device, namely, the linear polarizer (not shown) within the anti-reflection polarizing film 320, to finally prevent reflection to an outside of the display device.

Furthermore, similar to a case of an aspect of the present disclosure, tilted incident light that is incident from a tilted direction having a viewing angle of less than 90 degrees is refracted through an inclined surface 334a of the light path conversion protrusions 334 formed on a lower surface of the light path conversion layer 330, and converted into vertical incident light at 90 degrees. In other words, the tilted incident light is refracted by the light path conversion protrusions 334 and converted into the same incident light as the vertical incident light.

The tilted incident light converted into the vertical incident light is linearly polarized at 0 degree while passing through the linear polarizer (refer to reference numeral 120a in FIG. 5) within the light path conversion layer 330, and converted into left-handed circularly polarized light while passing through the circular polarizer (refer to reference numeral 120b in FIG. 5) therebelow.

Then, the left-handed circularly polarized light is reflected from the display panel 300 and converted into right-handed circularly polarized light.

Furthermore, the converted right-handed circularly polarized light is converted into 90-degree linearly polarized light while passing through the circular polarizer (not shown), and finally absorbed through the linear polarizer (not shown) to prevent reflection.

Therefore, even if the tilted incident light is reflected within the display device similar to the vertical incident light, the reflected light is substantially absorbed into an inside of the display device, namely, the linear polarizer (not shown), to prevent reflection to an outside of the display device.

As described above, the tilted incident light may be converted into the vertical incident light through the light path conversion protrusions 334 provided in the light path conversion layer 330 in a sheet form separated from the cover window 340, thereby preventing reflection of both the vertical and tilted incident light.

FIGS. 12A through 12D are fabrication process views for explaining a fabrication method of a display device according to still another aspect of the present disclosure.

Figure 12A:
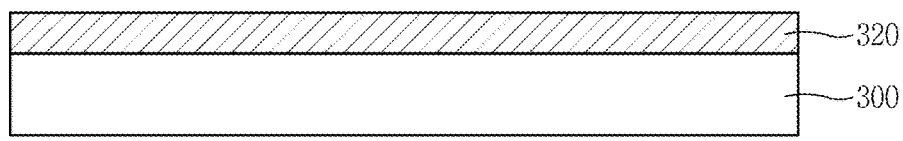
FIGS. 12A through 12D are fabrication process views for explaining a fabrication method of a display device according to still another aspect of the present disclosure.

Describing a fabrication method of a display device according to another aspect of the present disclosure, first, a display panel 300 is formed as illustrated in FIG. 12A. Here, the display panel 300 may include an organic light emitting display panel (OLED), a liquid crystal display panel (LCD), and a plasma display panel (PDP).

According to the present disclosure, among these display devices, an organic light emitting display (OLED) will be described as an example.

The display panel 300 according to another aspect of the present disclosure has the same structure as that of the display panel 100 according to the previously described aspect of the present disclosure, and a fabrication method thereof is also the same, and thus the description of a fabrication process of the display panel 300 will be omitted.

Then, as illustrated in FIG. 12A, an anti-reflection polarizing film 320 is bonded to an upper portion of the display panel 300. Here, the anti-reflection polarizing film 320 is a polarizer for preventing incident light from being reflected, and the anti-reflection polarizing film 320 includes a linear polarizer (refer to reference numeral 120a in FIG. 5) and a circular polarizer (refer to reference numeral 120b in FIG. 5).

Figure 12B:

Subsequently, as illustrated in FIG. 12B, a resin layer 332 is prepared, and an upper surface of the resin layer 332 is selectively etched by a predetermined thickness through a mask process and an etching process to form a plurality of light path conversion protrusions 334 spaced apart from each other by a predetermined distance. Here, each of the light path conversion protrusions 334 may have a quadrangular pyramid shape or a conical shape. Furthermore, each of the light path conversion protrusions 334 includes an inclined surface 334a and a bottom surface 334b, and the bottom surface 334b may be flat so as to be well bonded to the anti-reflection polarizing film 320.

Then, the optical sheet 336 is adhered to the bottom surface 330 of the light path conversion protrusions 334 to form the light path conversion layer 330 in a sheet form.

Figure 12C:
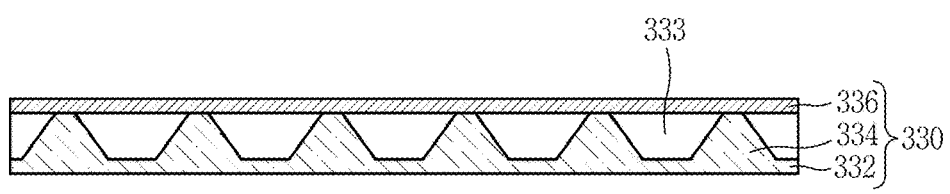

Then, as illustrated in FIG. 12C, the light path conversion layer 330 is disposed at and bonded to an upper portion of the anti-reflection polarizing film 320. Here, the optical sheet 336 below the light path conversion layer 330 is brought into contact with and bonded to an upper surface of the anti-reflection polarizing film 320.

Here, a space portion 333 including an air layer having a refractive index (n) of 1 is formed between the light path conversion protrusions 332 and the anti-reflection polarizing film 320. Here, refraction of light due to a difference in refractive index between media, namely, between the light path conversion layer 130 and the air appears between the light path conversion protrusions 332 and the space portion 333.

In addition, a medium layer (not shown) having a refractive index smaller than that of the light path conversion protrusion 332 may be filled in the space portion 333.

Moreover, a refractive index of the light path conversion protrusion 334 may be larger than that of the space portion 333.

Figure 12D:
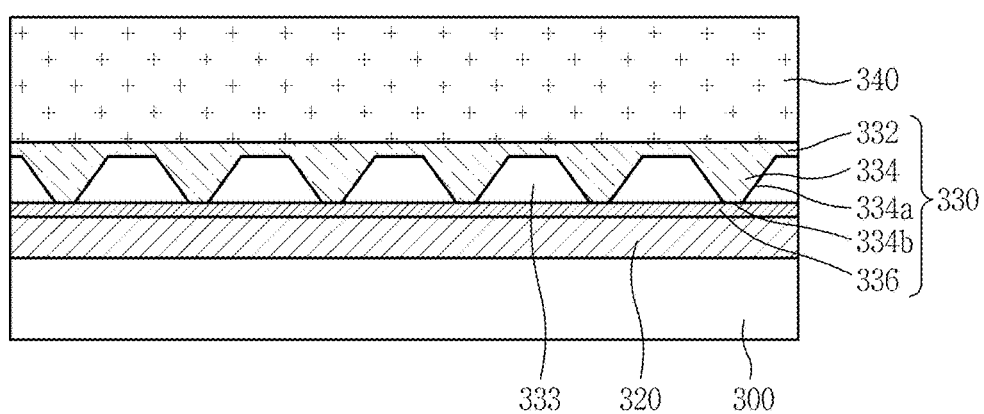

Then, as illustrated in FIG. 12D, the cover window 340 is disposed at and bonded to an upper portion of the light path conversion layer 330 to complete a display device fabrication process according to still another aspect of the present disclosure.

Figure 13A:
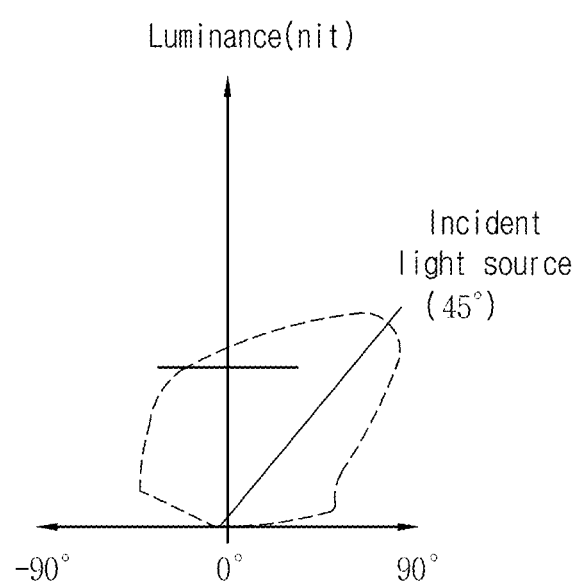
Figure 13B:
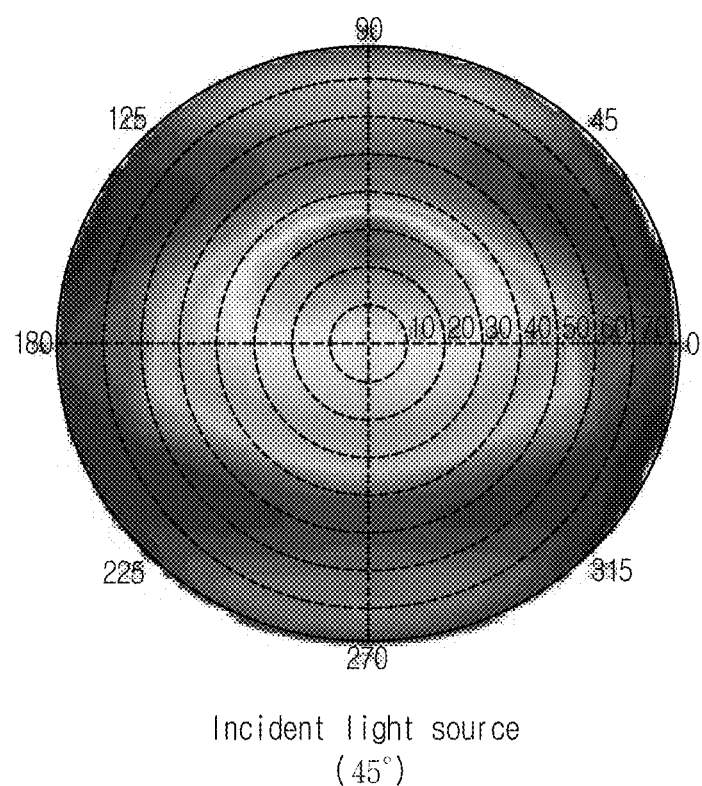

FIGS. 13A and 13B are views illustrating a luminance and a color distribution of an incident light source at a viewing angle of 45 degrees in display devices according to the present disclosure, wherein FIG. 13A is a view illustrating a luminance of the incident light source at a viewing angle of 45 degrees, and FIG. 13B is a view illustrating a color distribution of the incident light source at a viewing angle of 45 degrees;

Referring to FIGS. 13A and 13B, when the incident light source at up, down, left, and right viewing angles in all directions is incident on a display device according to the aspects of the present disclosure, it is seen that the brightness and the red, green, blue colors thereof are distributed in various directions.

Figure 14A:
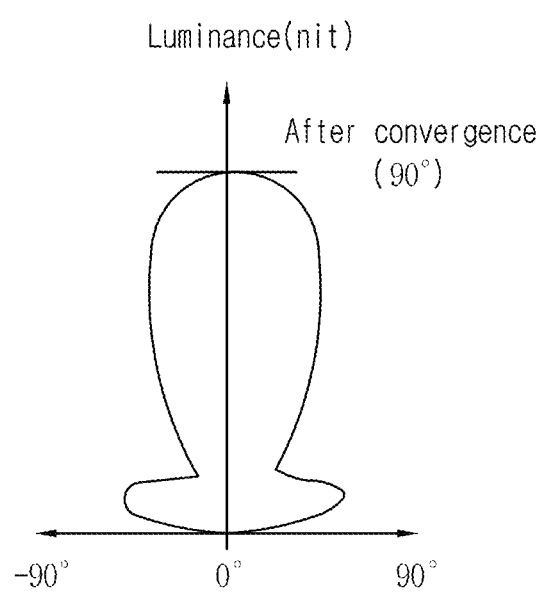
Figure 14B:
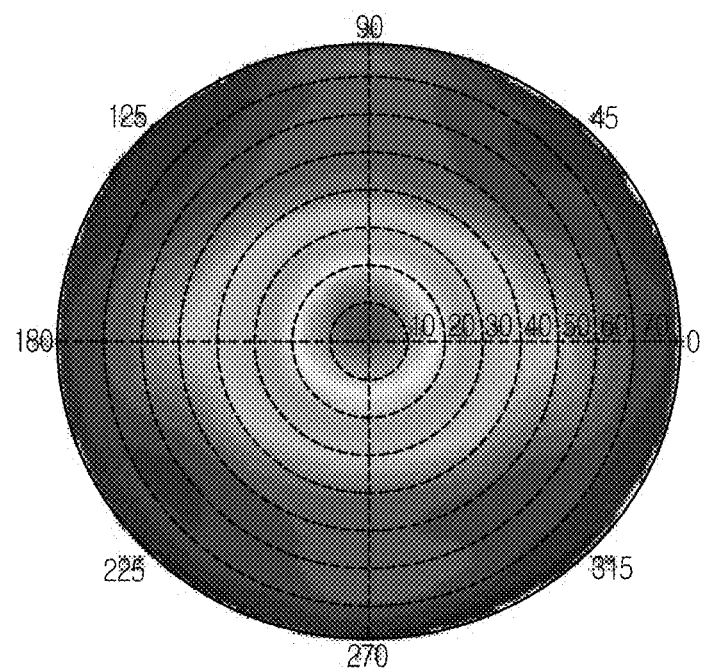

FIGS. 14A and 14B are views illustrating a luminance and a color distribution of after the incident light source at a viewing angle of 45 degrees has converged at 90 degrees through light path conversion protrusions, in a display device according to the present disclosure, wherein FIG. 14A is a view illustrating a luminance after the incident light source at a viewing angle of 45 degrees has converged at 90 degrees, and FIG. 14B is a view illustrating a color distribution after the incident light source at a viewing angle of 45 degrees has converged at 90 degrees.

However, referring to FIGS. 14A and 14B, since the incident light source at up, down, left, and right viewing angles in all directions is incident on a display device according to the aspects of the present disclosure and refracted through the light path conversion protrusions (refer to reference numeral 132 in FIG. 5, reference numeral 234 in FIG. 8 and reference numeral 334 in FIG. 9) and converted and converged into vertical incident light, it is seen that the brightness and the red, green, blue colors thereof are converged and distributed toward the center of the display device.

The horizontal line of FIGS. 13A and 14B means the vertical direction of FIGS. 13B and 14B. This means that the incoming external light comes in the diagonal direction of 45 degrees in FIG. 13A, and comes in front (0 degrees in FIG. 14A).

The axes in FIGS. 13B and 14B and the numbers on the axis represent the angle at which the light enters. And the numbers on the axis are the data of the intensity of the light. That is, the red part in the center is the part where the light comes in a lot, and the part where the blue part comes in less.

The center point in FIGS. 13B and 14B is the front, and the portion having the left/right and up/down angle is a diagonal.

Figure 15:
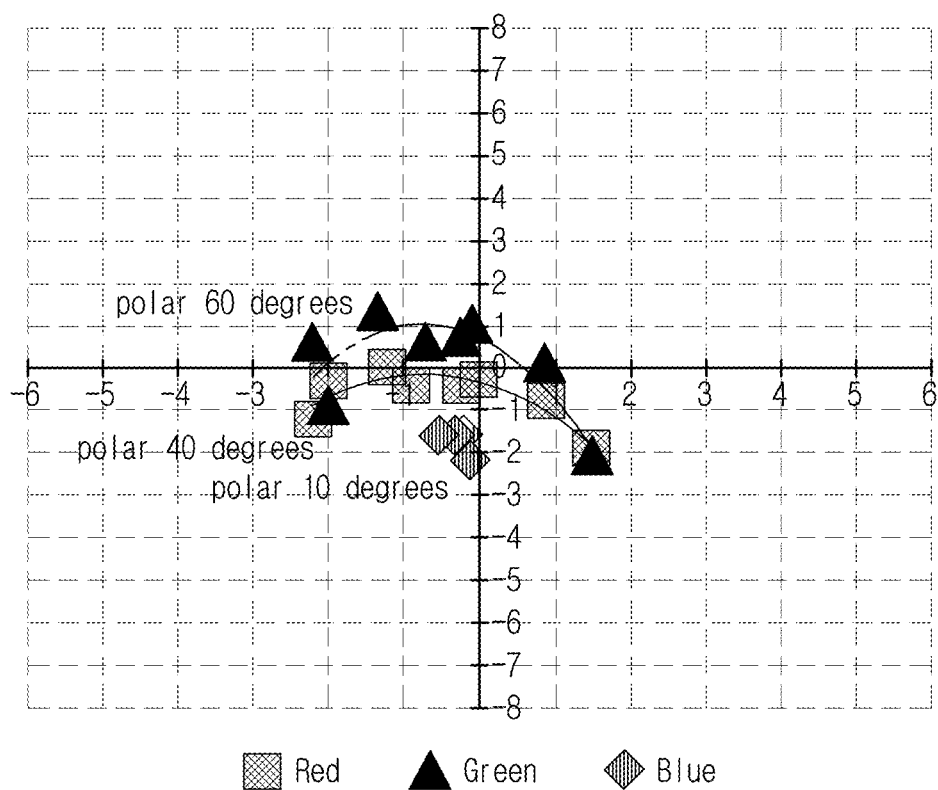
FIG. 15 is a view schematically illustrating a reflectance and a color shift of incident light at a side viewing angle in a display device according to an aspect of the present disclosure.

FIG. 15 is a view schematically illustrating a reflectance and a color shift of the incident light at a tilted viewing angle in a display device according to an aspect of the present disclosure.

Referring to FIG. 15, as a result of applying incident light having a tilted viewing angle, for example, a viewing angle of 60 degrees, to light path conversion protrusions provided in the cover window of the display device according to an aspect of the present disclosure, it is seen that a lateral reflectance is improved to be less than about 5.94%, and a lateral color shift is also improved.

The Polar 60 degrees mean the measurement angle, and the curve means the distribution of light.

In FIGS. 13 and 14, the numbers on the axis represent the angle. The numbers in FIG. 15 refer to color values, for example Red, Yellow, Green, Blue.

As described above, a display device according to the present disclosure and a fabrication method thereof have the following effects.

The present disclosure can improve the contrast and visibility by suppressing the reflection of external light against light incident at a viewing angle.

According to the present disclosure, a light path conversion layer is formed on the lower surface of a cover window, or a light path conversion layer having a plurality of light path conversion protrusions is provided between a cover window and an anti-reflection polarizing film, it is possible to prevent reflection of incident light from the viewing angle as well as vertical incident light.

Further, the present disclosure can improve the color shift by reducing the reflectance of the incident light from the viewing angle.

While the present disclosure has been particularly illustrated and described with reference to exemplary aspects thereof, it is to be understood that the disclosure is not limited to the disclosed exemplary aspects. It will be appreciated that other equivalent aspects are possible.

According to the present disclosure may suppress reflection of external light with respect to light incident at a viewing angle, thereby improving contrast and visibility.

Furthermore, according to the present disclosure, light path conversion protrusions may be formed on a lower surface of a cover window or a light path conversion layer having a plurality of light path conversion protrusions may be provided between the cover window and the anti-reflection polarizing film to convert view angle incident light into the same incident light as that of vertical incident light, thereby preventing reflection of incident light from a viewing angle as well as vertical incident light.

In addition, according to the present disclosure may reduce reflectance of incident light from a viewing angle, thereby improving color shift.

Although a display device according to the present disclosure and a fabrication method thereof have been described with reference to the aspects as illustrated in the drawings, these are merely illustrative, and it should be understood by those skilled in the art that various modifications and equivalent other aspects of the present disclosure can be made.

What is claimed is:

1. A display device, comprising:
a display panel on which an image is displayed;
an anti-reflection polarizing film disposed on the display panel; and
a cover window including a plurality of light path conversion protrusions disposed on the anti-reflection polarizing film,
wherein each of the plurality of light path conversion protrusions disposed to be isolated from one another in length and width directions of the cover window faces the display panel and has an inclined surface directing light entered from outside with less than 90 degrees with respect to the display panel to the 90 degrees and a flat bottom surface increasing a bonding area to facilitate bonding directly with the anti-reflection polarizing film, and a plurality of space portions is disposed between adjacent light path conversion protrusions.

2. The display device of claim 1, wherein the anti-reflection polarizing film includes a linear polarizer and a circular polarizer.

3. The display device of claim 1, wherein the light path conversion protrusions have a refractive index greater than that of the space portions.

4. The display device of claim 1, wherein the light path conversion protrusions have a refractive index of 1.5 to 1.7.

5. The display device of claim 1, further comprising a medium layer having a refractive index smaller than that of the light path conversion protrusions and filled in the space portions.

6. The display device of claim 5, wherein the medium layer has a refractive index of 1.0 to 1.4.

7. The display device of claim 1, wherein the light path conversion protrusions a gradually reducing width toward the display panel.

8. A display device, comprising:
a display panel on which an image is displayed;
an anti-reflection polarizing film disposed on the display panel;
a light path conversion layer including a plurality of light path conversion protrusions disposed on the anti-reflection polarizing film; and
a cover window disposed on the light path conversion layer,
wherein each of the plurality of light path conversion protrusions disposed to be isolated from one another in length and width directions faces the display panel and has an inclined surface directing light entered from outside with less than 90 degrees with respect to the display panel to the 90 degrees and a flat bottom surface increasing a bonding area to facilitate bonding directly with the anti-reflection polarizing film, and a plurality of space portions is disposed between adjacent light path conversion protrusions.

9. The display device of claim 8, wherein the anti-reflection polarizing film includes a linear polarizer and a circular polarizer.

10. The display device of claim 8, wherein the light path conversion layer includes a resin portion.

11. The display device of claim 10, wherein the light path conversion protrusions have a refractive index greater than that of the space portions.

12. The display device of claim 8, wherein the light path conversion protrusions have a refractive index of 1.5 to 1.7.

13. The display device of claim 10, further comprising a medium layer filled in the space portions and having a refractive index smaller than that of the light path conversion protrusions.

14. The display device of claim 13, wherein the medium layer has a refractive index of 1.0 to 1.4.

15. The display device of claim 10, wherein the light path conversion layer further includes an optical film disposed between the light path conversion protrusions and the anti-reflection polarizing film.

16. The display device of claim 8, wherein the light path conversion protrusions have a gradually reducing width toward the display panel.

17. A display device including a display panel displaying an image, comprising:
an anti-reflection polarizing film disposed on the display panel;
a cover window including a plurality of light path conversion protrusions disposed on the anti-reflection polarizing film, wherein each of the plurality of light path conversion protrusions disposed to be isolated from one another faces the display panel and has an inclined surface directing light entered from outside with less than 90 degrees with respect to the display panel to the 90 degrees and a flat bottom surface increasing a bonding area to facilitate bonding directly with the anti-reflection polarizing film; and
a plurality of space portions between adjacent light path conversion protrusions of the cover window protrusions,
wherein a difference in a refractive index between the space portions and the light path conversion protrusions is configured to suppress reflection of external light incident from 0 to 90 degrees with respect to a top surface of the display panel.

18. The display device of claim 17, further comprising a medium layer filled in the space portions and having a refractive index smaller than that of the light path conversion protrusions.

* * * * *